United States Patent [19]

Müller et al.

[11] 3,995,266
[45] Nov. 30, 1976

[54] DEVICE FOR SETTING AN ELECTRIC COMMAND VARIABLE

[75] Inventors: Karl-Heinz Müller; Volker Rindfleisch; Reinhard Schliepe; Torbjorn Dybwad, all of Berlin, Germany

[73] Assignee: Siemens Aktiengesellschaft, Munich, Germany

[22] Filed: May 15, 1975

[21] Appl. No.: 577,875

[30] Foreign Application Priority Data
May 17, 1974   Germany.............................. 2423967

[52] U.S. Cl. ...................... 340/347 DA; 235/92 EV
[51] Int. Cl.² ........................................ H03K 13/04
[58] Field of Search ........ 340/347 DA; 235/92 EV; 328/44, 14; 235/197; 318/603, 604, 605

[56] References Cited
UNITED STATES PATENTS 2,928,033   3/1960   Abbott................................ 318/604

3,763,414   10/1973   Clarke........................ 340/347 DA

Primary Examiner—Charles D. Miller
Attorney, Agent, or Firm—Kenyon & Kenyon Reilly Carr & Chapin

[57] ABSTRACT

A device for setting an electric command variable comprising parallel circuit branches for the coarse and fine adjustment of the variable is disclosed. In particular, the fine and coarse adjustment branches each include a digital bi-directional counter and a digital-analog converter. Upon exceeding the limits of the conversion range of the digital-to-analog converter of the fine branch, the counter therein is adjusted to a value which corresponds to a middle setting of its associated converter. To prevent the latter adjustment from causing a variation of the analog command variable, a corresponding correction of the counter in the coarse branch is then made. The present device has particular application in the setting of the energizing currents in magnetic lenses of an electron microscope.

7 Claims, 3 Drawing Figures

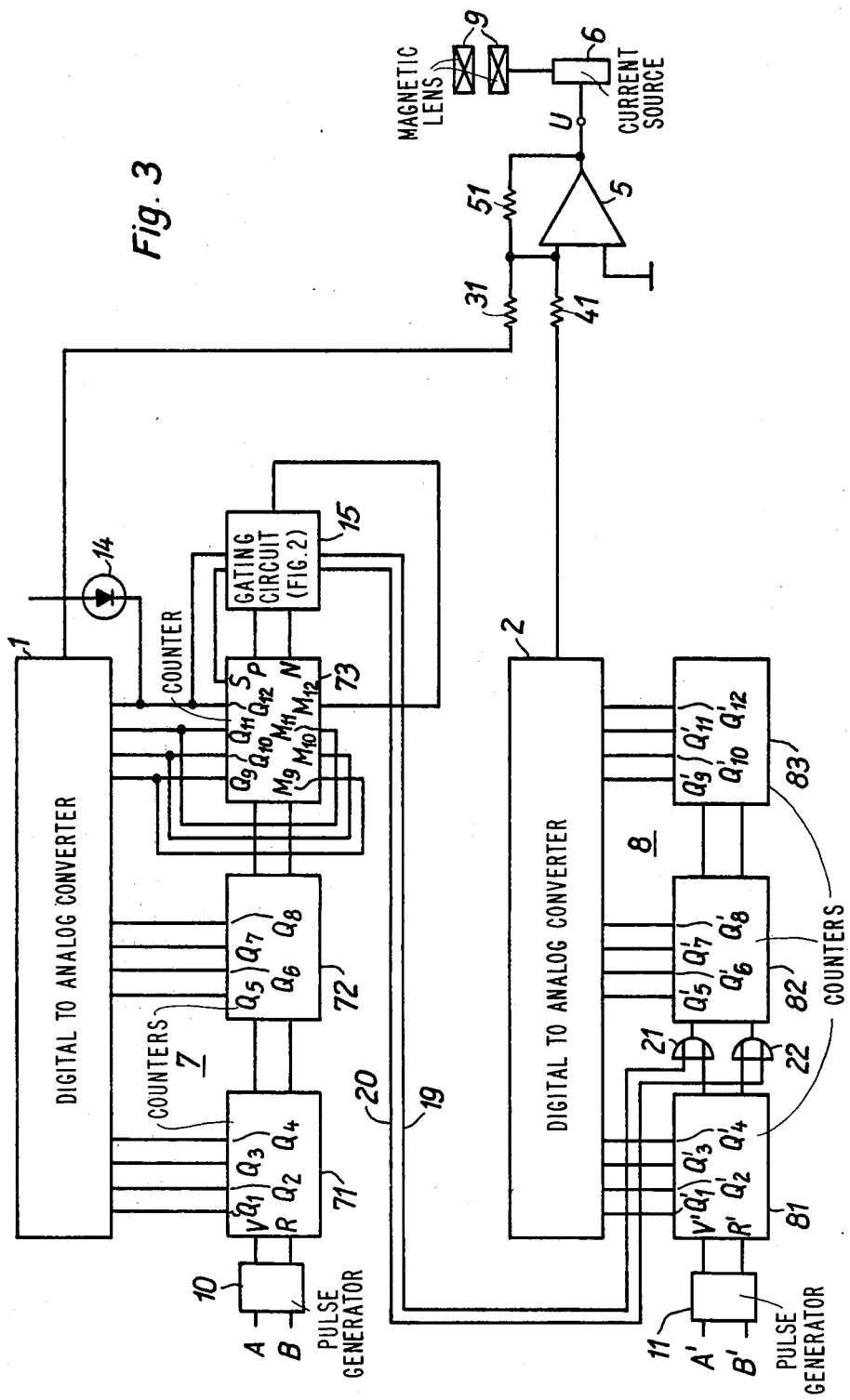

DEVICE FOR SETTING AN ELECTRIC COMMAND VARIABLE

BACKGROUND OF THE INVENTION

1. Field of the Invention

This invention relates to a device for setting an electric command variable and, in particular, to a device which includes digital-to-analog converters which are connected in parallel and which have analog outputs signals which are valued by means of electrical resistances.

2. Description of the Prior Art

A device of the above-described type is known from the article "Digital-Analog Converters with FET Switches" (in German) published in Elektronik, 1972, No. 2, Pages 39–43. This known device comprises three digital-to-analog converters which are connected in parallel and have analog output signals which are valued in powers of 10.

A disadvantage of the aforesaid known device results from the general property of a digital-to-analog converter of furnishing an output signal whose error equals one half the value of the bit position of minimum valuation of the converter. In particular, when an overflow jump occurs, i.e., when the limits of the conversion range of a digital-to-analog converter are exceeded or fallen short of, with the resulting variation of the setting of the digital-analog converter of next higher valuation, this results in a jump error, i.e. a setting error of the analog command variable.

The primary object of the present invention is thus to provide a device of the above-mentioned kind, in which the command variable can be varied from the value set after an overflow jump without the occurrence of further overflow jumps and the jump errors connected therewith.

SUMMARY OF THE INVENTION

In accordance with the principles of the present invention the above and other objectives are realized in a device of the above-described type by providing therein bidirectional counters for applying digital input signals to the digital-to-analog converters of the device. Additionally, a control apparatus is also provided which, when the limits of the conversion range of a digital-to-analog converter are exceeded or fallen short of, varies the counter associated therewith by a value which corresponds at least approximately to one half the conversion range of the digital-to-analog converter. The disturbances on the command variable caused by the latter correction are, in turn, compensated for by the control apparatus additionally causing a corresponding variation of the content of the counter associated with the digital-to-analog converter of the next greater valuation.

With the present device, when an overflow jump occurs as a result of a digital-to-analog converter exceeding or falling short of the limit of its conversion range, there simultaneously occurs a variation of the content of the counter assigned to this digital-analog converter by a value corresponding to one half the conversion range thereof. The latter variation of the counter content, in turn, now permits variation of the command variable without disturbances due to the setting errors connected with the overflow jump.

Advantageously, the control apparatus of the present device can be followed by a summation amplifier. In such case, the current supply of the digital-to-analog converters can be provided from voltage sources of low power. Also advantageously, the present device can be used for the current supply of a magnetic lens of an electron microscope. In such equipment, it is often necessary to vary the energizing current of the magnetic lens starting from a set value. If there corresponds to this value a setting of a digital-analog converter at a limit of its conversion range, use of the present device will prevent a multiple occurrence of jump errors and, hence, uncontrollable behavior of the magnetic lens.

In the present device, it is further advantageous to assign to each counter an indication device which indicates whether the digital-to-analog converter associated with the respective counter is in the first half of its conversion range. It can thus be determined whether the content of a counter can still be increased or reduced by a value which corresponds to half the conversion range of the digital-to-analog converter without a disturbing overflow jump occurring. It may happen that the range of the respective digital-to-analog converter available for the stepwise reduction of the command variable is smaller than one half its conversion range, and that it is, moreover, necessary to reduce the command variable by the amount corresponding to this one half conversion range without disturbances from overflow jumps. In this case, the present device can be provided with a means for selectively varying the counter assigned to the digital-to-analog converter which acts to increase the content of the counter assigned to the digital-to-analog converter by a value corresponding to said one half conversion range and compensates this correction by correspondingly varying the content of the counter assigned to the digital-analog converter of the next greater valuation.

In similar manner, it may happen that the command variable is to be increased stepwise by an amount which corresponds to one half the conversion range of a digital-analog converter, but that this digital-to-analog converter is in the second half of its conversion range. In this case, the present device can be provided with a means for selectively decreasing the content of the counter assigned to this digital-to-analog converter by a value which corresponds to half the conversion range thereof, and which further varies, in a corresponding manner, the content of the counter assigned to the digital-analog converter of next greater valuation.

BRIEF DESCRIPTION OF THE DRAWINGS

A number of illustrative embodiments of the invention will now be discussed in greater detail in the following detailed description which makes reference to the accompanying drawings in which:

FIG. 3 shows a second embodiment of a device in accordance with the present invention.

DETAILED DESCRIPTION

Figure 1:
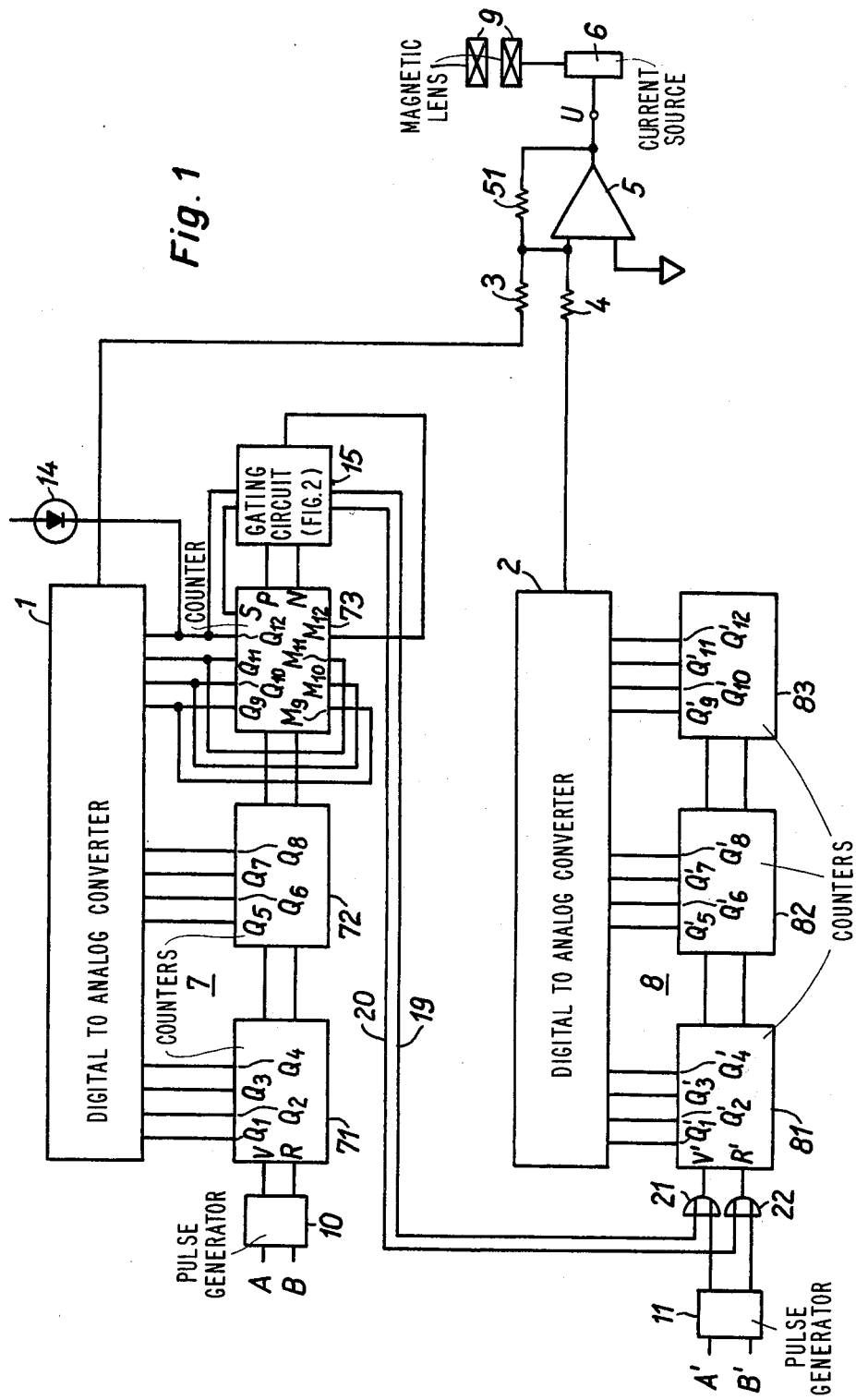
FIG. 1 is a block diagram of a device according to the invention.

The device illustrated in FIG. 1 has two digital bidirectional counters 7, 8, which serve as the coarse and fine adjustments of an analog-command variable. Each counter is a storage device designed as a binary counter having twelve digits. Moreover, each comprises three successive counter building blocks 71, 72, 73 and 81, 82, 83, respectively, each with four binary digits. Each of the two counters thus has $2^{12} = 4096$ different possible settings.

The two counters 7, 8 are followed by digital-to-analog converters 1, 2, which have a number of digital inputs equal to the number of digits of their corresponding counter, and which also have $2^{12} = 4096$ different settings. The digital inputs of the digital-to-analog converters 1, 2 are connected each with one of the outputs $Q_1$ to $Q_{12}$ and $Q'_1$ to $Q'_{12}$, respectively, of the counters 7, 8. To each of these outputs a binary digit is correlated. This correlation is effected so that $Q_1$, $Q'_1$ correspond to the lowest and $Q_{12}$, $Q'_{12}$ to the highest digit of the respective counters 7, 8.

The limits of the conversion range of the digital-to-analog converters 1, 2 are fixed by the minimum and maximum contents of the respective counters 7, 8. Moreover, the output signals of the two digital-to-analog converters 1, 2 are valued via electrical resistances 3, 4 and supplied thereby to a summation amplifier 5. The latter, in turn, is in negative feedback by means of an electrical resistance 51. The output voltage U of the amplifier 5 is identical with the analog command variable and is used to control the current source 6 of the magnetic lens 9 of an electron microscope which is shown symbolically.

The two resistances 3, 4 are designed so that a variation of the content of the counter 8 (coarse counter) by one unit results in a variation of the output voltage U of the summation amplifier 5 which, assuming error-free digital-to-analog converters, is equal to the variation of the voltage upon variation of the content of counter 7 (fine counter) by the value of the highest binary digit (2048). This means that the value of the electrical resistance 3 should, with the greatest possible accuracy, be 2048 times greater than the value of the electrical resistance 4.

The counters 7, 8 are fed counting pulses from pulse generators 10, 11 respectively. In particular, generators 10, 11 provide forward counting pulses to the forward count input V, V' and backward counting pulses to the backward count inputs R, R' of the counters 7, 8. The generators 10, 11, in turn, are energized via inputs A, B and A', B', respectively.

As shown, a luminous device 14 is connected with counter 7 to provide an indication of when the counter reading is less than half the maximum content of the counter. The luminous device 14 is designed as a luminous diode whose cathode is connected with the output $Q_{12}$ (binary digit of greatest valuation of counter 7). The anode of device 14 is at constant potential which is equal to the potential at the output $Q_{12}$ when the highest binary digit of counter 7 is in the logic stage H, i.e., when the respective digital-to-analog converter 1 is in the second half of its conversion range. The luminous diode 14, therefore, lights up when the digital-analog converter 1 is in the first half of its conversion range. At this time, the logic state L is set in the highest binary digit of counter 7, the latter state L being characterized by a lower potential at the output $Q_{12}$ than the potential occuring when the state H is set in the highest digit.

Associated with the counter 7 is a circuit part 15 which goes into action when the limits of the conversion range of the digitl-to-analog converter 1 are exceeded or fallen short of. The construction and mode of operation of circuit 15 are explained hereinbelow with reference to FIG. 2.

Figure 2:
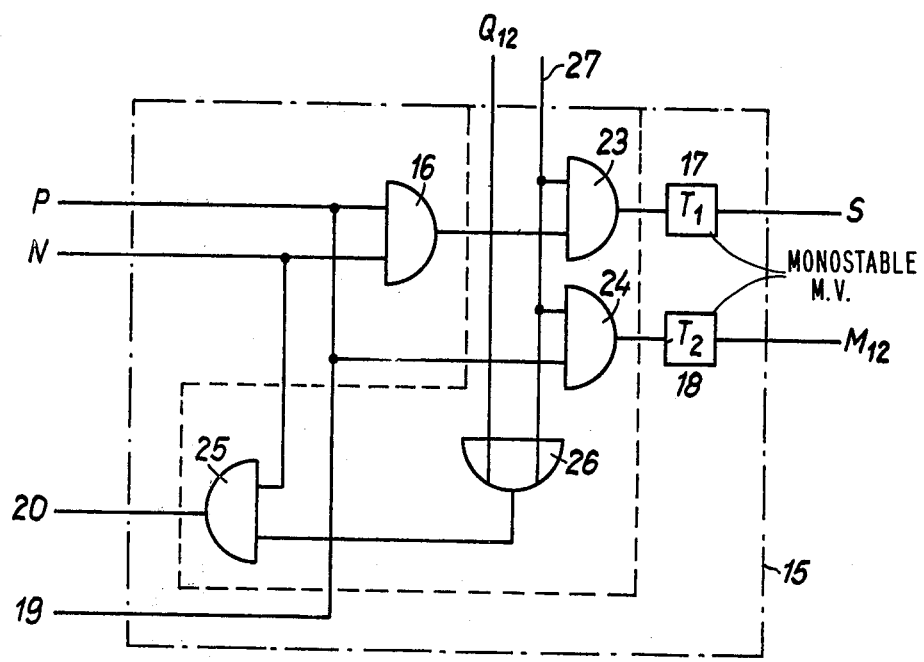
FIG. 2 shows in greater detail a circuit portion of the device shown in FIG. 1.

More specifically, as shown in FIG. 2, circuit 15 comprises AND gates 16 and 23–25, OR gate 25, a monstable flip-flop member 17 with the unstable state time $T_1$ and another monostable flip-flop member 18 with the unstable state time $T_2$. The time $T_1$ of flip-flop member 17 is selected greater than the signal transit time of counter 7 and smaller than the time $T_2$ of flip-flop member 18. The operation of the circuit in connection with the operation of the device of FIG. 1 will be explained first with reference to an overflow jump of the digital-to-analog converter 1 in positive direction.

In particular, let it be assumed that counter 7 has a maximum content, i.e., all binary digits of the counter are in state H. If the pulse generator 10 now supplies a forward count to the counter, this causes the digits of counter 7 to be adjusted to state L and a forward count pulse, i.e., a potential variation at output P of this counter. This forward count pulse then goes, via line 19 and the OR gate 21, to the input V' of counter 8 (see FIG. 1), thereby causing an increase of the content of counter 8 by one unit. Additionally, the forward count pulse also reaches the flip-flop member 18 and, via the AND gate 16 and the AND gate 23, the flip-flop member 17. The output pulse of flip-flop member 17 is supplied to a setting input S of the counting building block 73, and the output pulse of flip-flop member 18 is supplied to the enabling input $M_{12}$ which is assigned to and controls the highest binary digit of the block 73. The anabling inputs $M_9 - M_{11}$ relating to the other binary digits of building block 73 are respectively connected with the corresponding outputs $Q_9$, $Q_{10}$, $Q_{11}$. This ensure maintenance of the state L set in these other binary digits.

By the selection of the unstable state of the flip-flop members 17, 18 as above-described, the forward count pulse is still operative at the input $M_{12}$ after expiration of the signal transit time of counter 7 and, thus, sets the state H instead of state L in the highest binary digit of counter 7. Hence, counter 7 is set at a value of $2^{11} = 2048$. As can be shown, the latter setting combined with the one count increase in counter 8 causes the analog command variable U to undergo a total variation corresponding to the increase of the content of counter 7 by one unit. At the same time, counter 7 itself presents a content which corresponds to one half the conversion range of the digital-to-analog converter 1. The content of counter 7 can now be varied upward and downward, starting from the value now set without difficulties, i.e., without the output voltage of amplifier 5 being disturbed by setting errors connected with an overflow jump of the digital-to-analog converter 1.

Having discussed the operation of the circuit in the case of an overflow jump in positive direction, the mode of operation of the circuit will now be discussed for the case of an overflow jump in the negative direction. In particular, let it be assumed that counter 7 has reached its minimum content, i.e. all the digits of the counter are set in the state L. A backward count pulse of the pulse generator 10 now leads to a variation of all digits of counter 1 from L to H and to a backward count pulse, i.e., a potential variation at the output N of the counter. The circuit 15 now sends this backward count pulse, via line 20 and an OR gate 22, to counter 8 and reduces the content thereof by one unit. Simultaneously, it sends this pulse, via AND gate 23 during time $T_1$ to the setting input S. The latter thereby cause the output $Q_{12}$ to take over the information state L present at the enabling input $M_{12}$. The highest binary digit of counter 7 is thus in state L after expiration of the time $T_1$ of the flip-flop member 17. The resulting total variation of the output voltage U of the summation amplifier 5 thus corresponds to a reduction of the content of counter 7 by one unit.

As can be appreciated, therefore, in the case of an overflow jump of the digital-to-analog converter 1 in negative direction, counter 7 is also set to a value which approximately corresponds to one half the conversion range of the digital-analog converter 1. As a result, variation of the setting of this converter is readily possible after an overflow jump has taken place.

As shown in FIG. 2 and as above indicated, circuit 15 comprises a combination logic elements, i.e., AND gates 23, 24, 25 and an OR gate 26. By means of this combination of elements it is possible to increase the content of counter 7 selectively by the value 2048, i.e., by the value corresponding to one half the conversion range of the digital-to-analog converter 1. This pre-supposes, however, that the digital-to-analog converter 1 is in the first half of its conversion range. In such case, the state L is set in the highest binary digit of the respective counter 7.

Under the aforesaid assumption, the increase of the content of counter 7 can be effected by sending a pulse via a line 27 and the two AND gates 23, 24 to the two flip-flop members 17 and 18. In analogy to its mode of operation in the case of an overflow jump of the digital-to-analog converter 1 in positive direction, the flip-flop member 17 permits the pulse to become operative as a forward count pulse in the highest binary digit of counter 7.

In order to avoid a variation of the output voltage U of the summation amplifier 5 in the case of such a selective increase of the content of counter 7, the OR gate 26 is provided. It is connected with the output $Q_{12}$ and with line 27. If in the highest binary digit of counter 7 state L is set, the OR gate 26 sends a backward count pulse to the transfer line 20 via the AND gate 25 in the case of a pulse placed on line 27. In this way there occurs a reduction of the content of counter 8 by a value which corresponds to the increase of the content of counter 7.

The circuit shown in FIG. 3, is a variant of the circuit shown in FIG. 1. As shown, parts performing equal functions of those in FIG. 1 have been similarly enumerated. A forward or backward count pulse occurring at the outputs P or N of the counting building block 73 is now sent via the lines 19, 20, and the OR gates 21, 22 to the inputs of the counting building block 82. The content of this building block is increased or reduced by one unit by these pulses. This results in an increase or reduction of the content of counter 8 by $2^4 = 16$ units each time.

The resistances 31, 41 connected after the two digital analog converters 1, 2 are dimensioned in the circuit shown in FIG. 3, in analogy to the circuit of FIG. 1 so that an overflow jump of the digital-analog converter 1 results in a variation of the output voltage U of the summation amplifier 5 which corresponds to a variation of the content of counter 7 by one unit. This is achieved by selecting the value of the electrical resistance 31 so that it is 128 times greater than the value of the electrical resistance 41.

The circuit shown in FIG. 3 permits a reduction of the setting error of the output voltage U of the summation amplifier 5 that occurs with an overflow jump of the digital-analog converter 1. However, compared with the circuit shown in FIG. 1, there is a reduction of the total setting range of this voltage by four binary digits.

What is claimed is:
1. A device for setting a command variable which permits both coarse and fine adjustment comprising:
 a. a first, fine bi-directional counter having a plurality of stages;
 b. means for providing up and down counts into said first counter to adjust the count stored therein;
 c. a first digital to analog converter having its digital inputs coupled to the outputs of the respective stages of said first counter;
 d. a second, coarse counter having a plurality of stages, the highest digit in said second counter being assigned a value greater than the highest digit in said first counter, said counter having at least one digit assigned a value equal to that of the highest digit of said first counter;
 e. means for providing up and down counts to adjust the value stored in said second counter;
 f. a second digital to analog converter having its digital inputs coupled to the outputs of the respective stages of said second counter;
 g. means coupling the output of that last stage of said first counter to the stage of said second counter having an equal value such as to increment said stage of said second counter upon said first counter overflowing in a positive direction and to decrement said stage upon said first counter overflowing in a negative direction;
 h. means for setting said first counter to a value corresponding to approximately one-half its full value in response to overflow in a negative or positive direction and for compensating this correction by correspondingly varying the content of the second counter;
 i. means for summing the outputs of said first and second analog to digital converters including first and second resistors coupled respectively to the outputs of said first and second digital to analog converters the ratio of said first resistor to said second resistor being the inverse of the ratio of the value of the lowest digit in said first counter to the value of the lowest digit in said second counter.

2. An apparatus according to claim 1 wherein said means for summing further include a summing amplifier having said first and second resistors as input resistors.

3. A device in accordance with claim 2 further including:
 an electron microscope comprising a magnetic lens; and
 means for feeding the output of said amplifier as a current supply for said lens.

4. A device in accordance with claim 1 further including:
 first and second indicating devices for indicating when said first and second converters, respectively, are in the first half of their conversion ranges.

5. Apparatus according to claim 1 wherein said means for setting said first counter comprise means for setting the highest digit of said counter upon a positive overflow and means for resetting the highest digit of said counter upon a negative overflow.

6. Apparatus according to claim 1 wherein the output of said first counter is coupled to the first stage of said second counter.

7. Apparatus according to claim 6 wherein the output of said first counter is coupled to an intermediate stage of said second counter.

* * * * *